(12) United States Patent
Laterza et al.

(10) Patent No.: US 11,258,434 B1
(45) Date of Patent: Feb. 22, 2022

(54) LATCH ARCHITECTURE

(71) Applicant: SK hynix Inc., Gyeonggi-do (KR)

(72) Inventors: Marino Laterza, Agrate Brianza (IT); Mauro Pagliato, Agrate Brianza (IT)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/337,026

(22) Filed: Jun. 2, 2021

(30) Foreign Application Priority Data

Dec. 3, 2020 (IT) .......................... 102020000029771

(51) Int. Cl.
*G11C 7/10* (2006.01)
*H03K 3/037* (2006.01)

(52) U.S. Cl.
CPC ............. *H03K 3/037* (2013.01); *G11C 7/106* (2013.01)

(58) Field of Classification Search
CPC ..... G11C 7/1006; G11C 7/106; G11C 7/1066; G11C 7/1087; G11C 7/1093; G11C 7/22; G11C 7/222
See application file for complete search history.

(56) References Cited

U.S. PATENT DOCUMENTS

| | | | |
|---|---|---|---|
| 5,086,414 A * | 2/1992 | Nambu ..................... | G11C 8/18 365/230.08 |
| 6,026,036 A * | 2/2000 | Sekiya ................. | G11C 7/1072 365/200 |
| 7,391,250 B1 | 6/2008 | Chuang | |
| 7,826,280 B2 * | 11/2010 | Goetz ..................... | G11C 16/28 365/189.15 |
| 7,903,492 B2 | 3/2011 | Ide et al. | |
| 10,429,443 B2 | 10/2019 | Kim et al. | |
| 2004/0047221 A1 | 3/2004 | Tanaka | |
| 2017/0076778 A1 | 3/2017 | Mochida | |
| 2019/0325947 A1 * | 10/2019 | Chen ..................... | G11C 7/1006 |

OTHER PUBLICATIONS

Search Report issued by the European Patent Office dated Sep. 2, 2021.

* cited by examiner

*Primary Examiner* — Patrick O Neill
(74) *Attorney, Agent, or Firm* — IP & T Group LLP

(57) ABSTRACT

Disclosed is a latch architecture comprising an input circuit receiving input data and; a combinational network providing first intermediate data, first intermediate control signal and second intermediate control signal, based on latched input data from the input circuit; one or more first latches providing latched first intermediate data; a second latch providing a latched first intermediate control signal; a third latch providing a latched second intermediate control signal; and at least one fourth latch providing the output data; a decoder connected to the first latch and receiving the latched first intermediate data and providing second intermediate data. The at least one fourth latch receives input signals modified based on the latched first intermediate control signal, the latched second intermediate control signal and the second intermediate data. The first to third latches operate at an inverted clock signal and the at least one fourth latch operates at a non-inverted clock signal.

20 Claims, 7 Drawing Sheets

LATCH ARCHITECTURE

CROSS-REFERENCE TO RELATED APPLICATION

The present application claims priority under 35 U.S.C. § 119(a) to Italian patent application number 102020000029771, filed on Dec. 3, 2020, in the Italian Intellectual Property Office, the entire disclosure of which is incorporated herein by reference.

FIELD OF THE INVENTION

The present disclosure relates to latch architecture.

BACKGROUND

As it is well known, lower power consumption has become an important parameter to be taken into account when designing integrated circuits mainly due to widespread use of portable and handheld applications. Likewise, of the uttermost importance is also the area occupation of the integrated circuits.

Integrated circuits usually comprise flip-flop and latch circuits being organized in suitable architectures, for instance to be used to exchange data.

A conventional architecture to output data from a microcontroller is shown for instance in FIG. 1.

The architecture 100 comprises an input unit 110 being a delay flip-flop (DFF) and receiving input data ROMDATA, for instance from a ROM memory of a microcontroller, and a clock signal OUT_CLK. The input unit 110 provides latched data ROMDATA_L to a decoder logic 120 in turn connected to an output unit 130. Likewise, the output unit 130 is a delay flip-flop (DFF) connected to the clock signal OUT_CLK and providing output data MC_OUT.

The architecture 100 thus has a synchronous behaviour thanks to the use of flip-flop units and of the common clock signal OUT_CLK. Unfortunately, such a known architecture usually shows not a negligible area occupation, especially when a large amount of data has to be transferred.

A scan flip-flop architecture including an input unit configured to select one signal from among a data input signal and a scan input signal, and to supply the selected signal as an internal signal according to an operation mode as well a flip-flop configured to latch the internal signal according to a clock signal is described in the U.S. Pat. No. 10,429,443. A data retention cell for preserving an output data signal in a power-saving mode comprising an input control circuit in the form of a delay flip-flop (DFF) and a master-slave flip-flop, in turn including a master latch unit and a slave latch unit, is also disclosed in the U.S. Pat. No. 7,391,250.

SUMMARY

Embodiments of the invention are directed to a latch architecture to output data from a microcontroller being suitably designed in order to reduce its area occupation.

The aim of the proposed latch architecture is to reduce the area occupation and increase the transfer speed of data exchanged from a microcontroller.

In an embodiment of the invention, a latch architecture having an input terminal receiving input data and an output terminal providing output data, the latch architecture comprising: an input circuit connected to the input terminal of the latch architecture, receiving the input data from the input terminal and providing latched input data; a combinational network connected to the input circuit, receiving the latched input data from the input circuit and providing first intermediate data, a first intermediate control signal and a second intermediate control signal; wherein the latch architecture further comprises: one or more first latches connected to the combinational network, receiving the first intermediate data and providing latched first intermediate data; a second latch connected to the combinational network, receiving the first intermediate control signal and providing a latched first intermediate control signal; a third latch connected to the combinational network, receiving the second intermediate control signal and providing a latched second intermediate control signal; at least one fourth latch connected to the output terminal of the latch architecture and providing the output data; a decoder connected to the first latch and receiving the latched first intermediate data; at least one first AND gate connected to the decoder, receiving second intermediate data from the decoder, and the latched first intermediate control signal from the second latch, and providing set-enabled second intermediate data to a first input terminal of the fourth latch; and at least one second AND gate connected to the decoder, receiving second intermediate data from the decoder and the latched second intermediate control signal from the third latch, and providing reset-enabled second intermediate data to a second input terminal of the fourth latch, wherein the first AND gate and the second AND gate provide the fourth latch with respective input signals; wherein the one or more first latches, the second latch and the third latch receive a clock signal at an inverted clock terminal and the fourth latch receives the clock signal at a clock terminal.

In an embodiment of the invention, a latch circuit comprising: input and output terminals; an input circuit coupled to the input terminal, and configured to receive input data from the input terminal and generate latched input data; a combinational network coupled to the input circuit, and configured to receive the latched input data from the input circuit and generate first intermediate data, a first intermediate control signal and a second intermediate control signal using the latched input data; a first register coupled to the combinational network, and configured to receive the first intermediate data, the first intermediate control signal and the second intermediate control signal, and generate latched first intermediate data, a latched first intermediate control signal and a latched second intermediate control signal using a clock signal and an asynchronous active-low reset signal; a decoder coupled to the first register, and configured to receive the latched first intermediate data and generate second intermediate data; one or more logic gates coupled to the decoder and the first register, and configured to receive the second intermediate data, the latched first intermediate control signal and the latched second intermediate control signal, and generate set-enabled second intermediate data and reset-enabled second intermediate data using a combination of the second intermediate data, the latched first intermediate control signal and the latched second intermediate control signal; and a second register coupled to the logic gates, and configured to receive the set-enabled second intermediate data and the reset-enabled second intermediate data, generate output data using a combination of the set-enabled second intermediate data, the reset-enabled second intermediate data, the clock signal and the asynchronous active-low reset signal, and output the output data to the output terminal, wherein the first register includes a D-latch and the second register includes an SR-latch.

According to another embodiment of the invention, the first latch has an input terminal receiving the first intermediate data from the combinational network and an output terminal providing latched first intermediate data to the decoder, the second latch has an input terminal receiving the first intermediate control signal from the combinational network and an output terminal providing latched first intermediate control signal to the first AND gate and the third latch has an input terminal receiving the second intermediate control signal from the combinational network and an output terminal providing latched second intermediate control signal to the second AND gate; the first, second and third latches each comprising: a first logic gate having a first input terminal connected to the input terminal of the respective latch and a second input terminal receiving a clock signal through a first inverter; a second logic gate having a first input terminal receiving the clock signal through the first inverter and a second input terminal connected to the input terminal of the respective latch through a second inverter; a third logic gate having a first input terminal connected to an output terminal of the first logic gate; and a fourth logic gate having a first input terminal connected to the output terminal of the second logic gate; the third logic gate and fourth logic gate being cross connected, the third logic gate having an output terminal connected to a second input terminal of the fourth logic gate and the fourth logic gate having an output terminal connected to a second input terminal of the third logic gate, the fourth logic gate further having a third input terminal receiving an asynchronous active-low reset signal and the output terminal connected, through a third inverter to the output terminal of the respective latch.

According to a further embodiment, the fourth latch has a first input terminal receiving the set-enabled second intermediate data from the first AND gate, a second input terminal receiving the reset-enabled second intermediate data from the second AND gate and an output terminal providing the output data and comprises: a first logic gate having a first input terminal connected to the first input terminal of the fourth latch and a second input terminal receiving a clock signal; a second logic gate having a first input terminal receiving the clock signal and a second input terminal connected to the second input terminal of the fourth latch; a third logic gate having a first input terminal connected to an output terminal of the first logic gate; a fourth logic gate having a first input terminal connected to an output terminal of the second logic gate; a fifth logic gate having a first input terminal connected to an output terminal of the third logic gate, a second input terminal receiving the asynchronous active-low reset signal and an output terminal connected, through an inverter, to the output terminal of the fourth latch; the fourth logic gate having a second input terminal connected to the output terminal of the fifth logic gate and the output terminal connected to a second input terminal of the third logic gate.

Finally, according to another embodiment, the decoder receives latched first intermediate data from the first latch and provides second intermediate data to the first AND gate and second AND gate by means of different levels of internal logic gates.

BRIEF DESCRIPTION OF THE DRAWINGS

The characteristics and advantages of the present disclosure will be apparent from the following description of embodiments thereof given by way of indicative and not limiting examples with reference to the annexed drawings, in which.

DETAILED DESCRIPTION OF THE EMBODIMENTS

Figure 1:
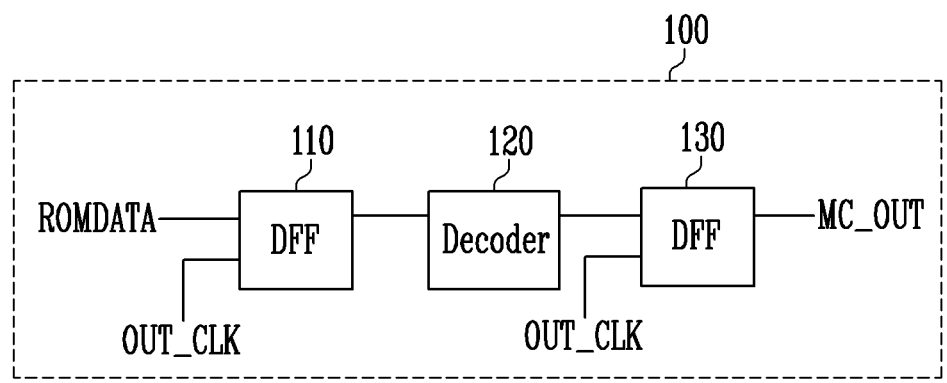
FIG. 1 shows an architecture to output data from a microcontroller according to a prior art solution.

Various embodiments of the present invention will be described in detail below with reference to the accompanying drawings. While the present invention is shown and described in connection with embodiments thereof, it will be apparent to those skilled in the art that various modifications can be made without departing from the spirit and scope of the invention. The terms and words used in the specification and claims should not be construed as their ordinary or dictionary sense. On the basis of the principle that the inventor can define the appropriate concept of a term in order to describe his/her own invention in the best way, it should be construed as a meaning and concepts for complying with the technical idea of the present invention. In addition, detailed descriptions of constructions being well known in the art may be omitted to avoid unnecessarily obscuring the clarity of the present invention.

In the drawings, corresponding features are identified by the same reference numerals.

Figure 2:
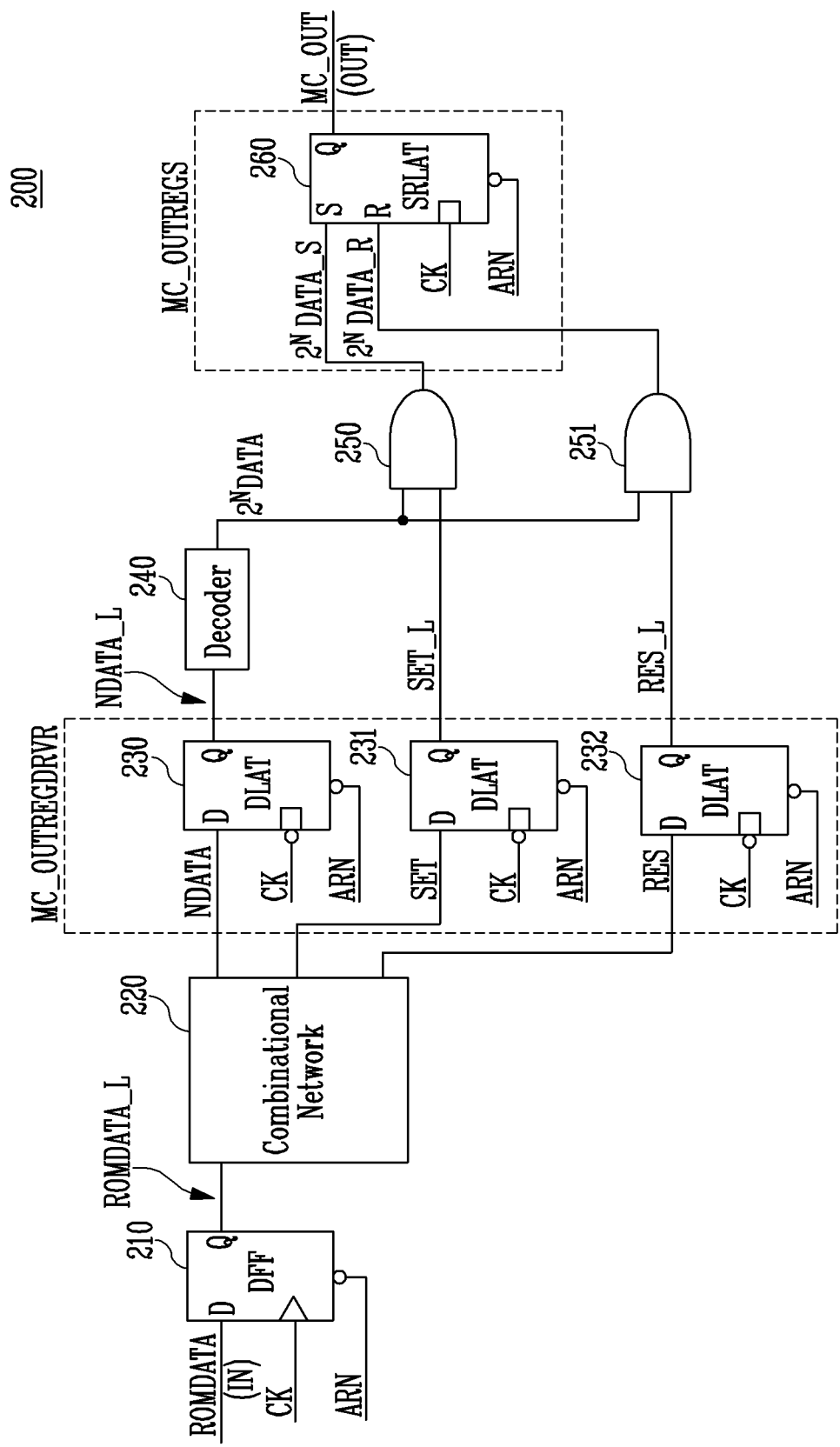
FIG. 2 shows a latch architecture according to an embodiment of the present disclosure.

A latch architecture 200 according to an embodiment of the present disclosure is shown in FIG. 2.

The latch architecture 200 comprises an input circuit 210 being a delay flip-flop (DFF) and receiving input data ROMDATA, for instance from a ROM memory of a microcontroller, at an input terminal IN of the latch architecture 200, as well as a clock signal CK and an asynchronous active-low reset signal ARN. The input circuit 210 provides latched data ROMDATA_L to a combinational network 220 in turn providing first intermediate data NDATA to a first latch 230, a first intermediate control signal SET to a second latch 231 and a second intermediate control signal RES to a third latch 232. The latch architecture 200 may comprise a series of one or more first latches 230 connected to the combinational network 220.

The first latch 230 is a level-sensitive latch, in turn receiving the clock signal CK and the asynchronous active-low reset signal ARN, as well as the first intermediate data NDATA from the combinational network 220. The first latch 230 is connected to a first AND gate 250 and to a second AND gate 251 through a decoder 240. Likewise, the second latch 231 is a level-sensitive latch, receiving the clock signal CK and the asynchronous active-low reset signal ARN, as well as the first intermediate control signal SET from the combinational network 220. The second latch 231 has an output terminal connected to the first AND gate 250. Similarly, the third latch 232 is a level-sensitive latch, receiving the clock signal CK and the asynchronous active-low reset signal ARN, as well as the second intermediate control signal RES from the combinational network 220. The third latch 232 has an output terminal connected to the second AND gate 251.

The decoder 240 receives latched first intermediate data NDATA_L from the first latch 230 and provides both the first AND gate 250 and the second AND gate 251 with second intermediate data $2^N$ DATA. The first AND gate 250 is a 2-input AND gate receiving the second intermediate data $2^N$ DATA from the decoder 240 and latched first intermediate control signal SET_L from the second latch 231. The first AND gate 250 provides the fourth latch 260 with set-enabled second intermediate data $2^N$ DATA_S.

The second AND gate 251 is a 2-input AND gate receiving second intermediate data $2^N$ DATA from the decoder 240 and a latched second intermediate control signal RES_L from the third latch 232. The second AND gate 251 provides the fourth latch 260 with reset-enabled second intermediate data $2^N$ DATA_R.

The fourth latch 260 is a gated SR latch (SRLAT), in turn receiving the clock signal CK and the asynchronous active-low reset signal ARN as well as the set-enabled second intermediate data $2^N$ DATA_S from the first AND gate 250 and the reset-enabled second intermediate data $2^N$ DATA_R from the second AND gate 251. The fourth latch 260 provides output data MC_OUT at an output terminal OUT of the latch architecture 200.

It should be remarked that the latch architecture 200 comprises a gated SR latch (SRLAT) as a fourth latch 260 instead of a D-latch (DLAT) in order to allow to keep memory of the previously latched data in case both inputs of the latch are low and the clock signal CK is high, without adding output feedback and multiplexing logic to the input of the latch.

Suitably, the first latch 230, the second latch 231 and the third latch 232 are synchronized with the low pulses of the clock signal CK, being received at an inverted clock terminal of the first latch 230, the second latch 231 and the third latch 232, respectively, while the fourth latch 260 is synchronized with the high pulses of the clock signal CK being provided to a non-inverted clock terminal of the fourth latch 260.

In essence, the latch architecture 200 comprises an output circuit suitably divided into a series of D-latches (DLAT) and an SR-latch (SRLAT), the size of the circuit outputting input data ROMDATA to the circuit outputting data MC_OUT being thus sequentially reduced.

In particular, the first intermediate data NDATA being a n-bit signal is transferred to the second intermediate data $2^N$DATA being a $2^n$-bit signal thanks to the decoder 240 being an n-to-$2^n$ decoder.

Suitably, a plurality of first latches 230 are included into a first register MC_OUTREGDRVR of a microcontroller and connected to a plurality of fourth latches 260 included in a second register MC_OUTREGS of the microcontroller by means of a plurality of combinational blocks of the decoder 240 and a plurality of both first AND gates 250 and second AND gates 251.

Figure 3A:
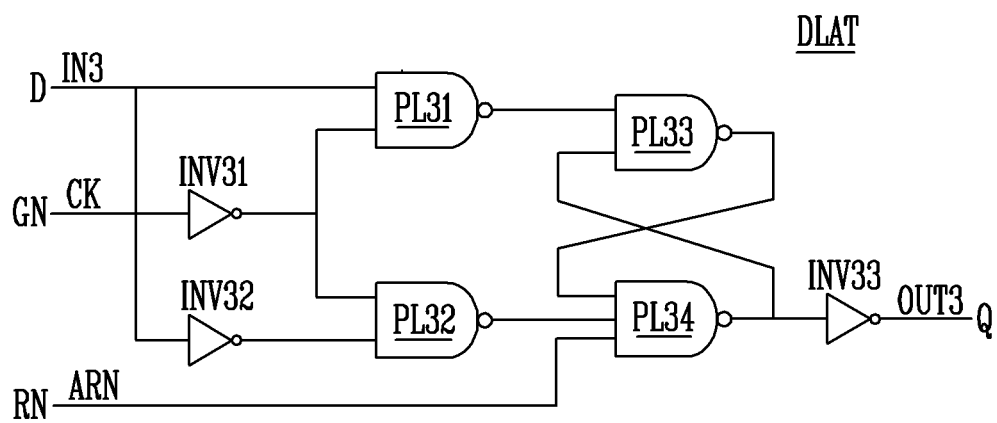
FIGS. 3A-3B and 4A-4B show circuital structures of different latches of the latch architecture of FIG. 2.

According to an embodiment of the present disclosure, as shown in FIG. 3A, the first latch 230, the second latch 231 and the third latch 232 each comprise a first logic gate PL31 having a first input terminal connected to the input terminal IN3 and a second input terminal receiving a clock signal CK through a first inverter INV31 as well as a second logic gate PL32 having a first input terminal receiving the clock signal CK through the first inverter INV31 and a second input terminal connected to the input terminal IN3 of the respective latch through a second inverter INV32. The first logic gate PL31 and the second logic gate PL32 have respective output terminals connected to first input terminals of a third logic gate PL33 and of a fourth logic gate PL34, being cross connected. In particular, the third logic gate PL33 has an output terminal connected to a second input terminal of the fourth logic gate PL34, which in turn has an output terminal connected to a second input terminal of the third logic gate PL33.

The fourth logic gate PL34 also has a third input terminal receiving the asynchronous active-low reset signal ARN and its output terminal is connected, through a third inverter INV33, to an output terminal OUT3 providing output data Q.

Within the latch architecture 200, the input terminal IN3 of the first latch 230 receives the first intermediate data NDATA from the combinational network 220 and the output terminal OUT3 provides the latched first intermediate data NDATA_L to the decoder 240; the input terminal of the second latch 231 receives the first intermediate control signal SET from the combinational network 220 and the output terminal OUT3 provides the latched first intermediate control signal SET_L to the first AND gate 250; and the input terminal of the third latch 232 receives the second intermediate control signal RES from the combinational network 220 and the output terminal OUT3 thereof provides the latched second intermediate control signal RES_L to the second AND gate 251.

All the logic gates comprised in the first latch 230, in the second latch 231 and in the third latch 232 are NAND gates.

Figure 3B:
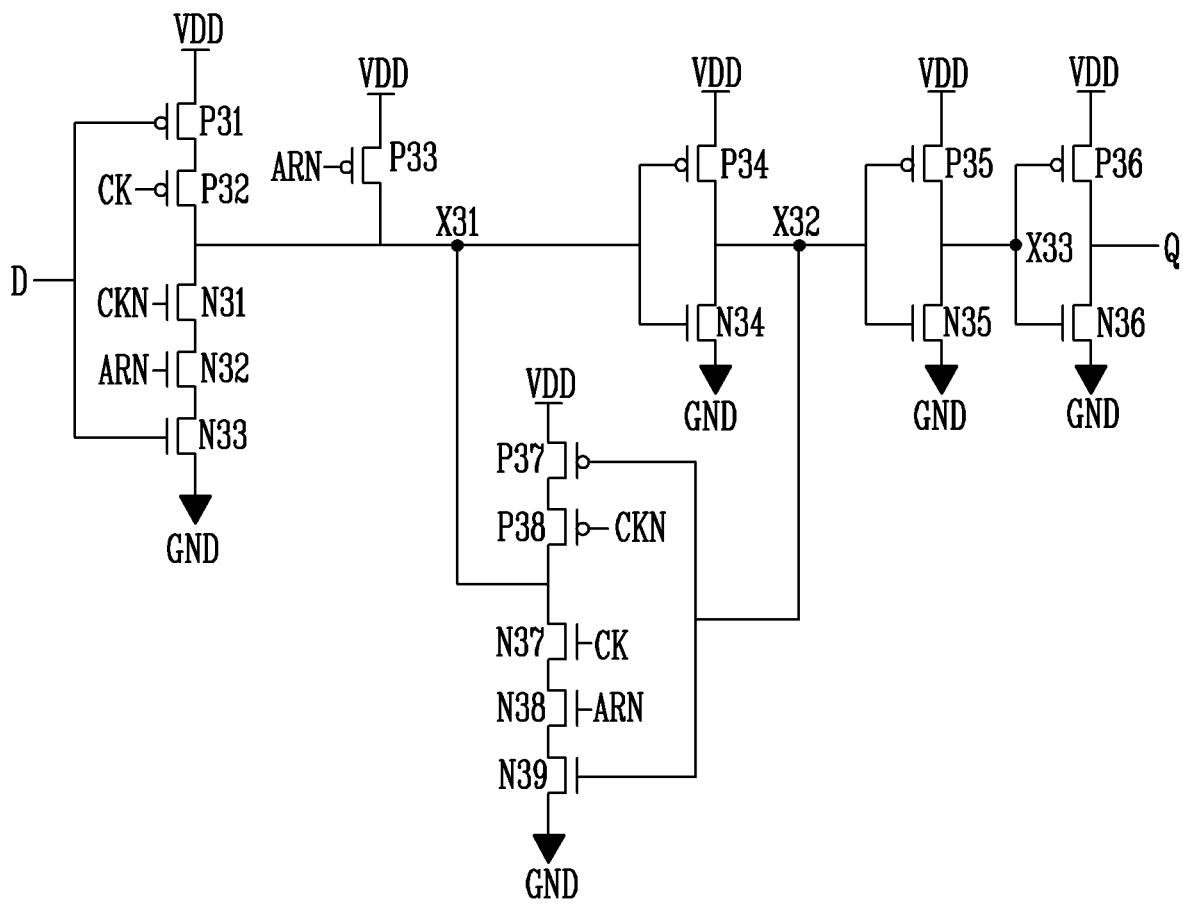

The first latch 230, the second latch 231 and the third latch 232 are each realized by means of MOS transistors of the N-type and of the P-type according to the embodiment shown in FIG. 3B.

According to this embodiment, the first latch 230, the second latch 231 and the third latch 232 each comprise a first PMOS transistor P31 and a second PMOS transistor P32 inserted, in series to each other, between a voltage reference VDD and a first internal circuit node X31. The first PMOS transistor P31 has a control or gate terminal connected to the input terminal IN3, receiving the input data D, and the second PMOS transistor P32 has a control or gate terminal receiving the clock signal CK.

As previously described, within the latch architecture 200, the input terminal of the first latch 230 receives the first intermediate data NDATA from the combinational network 220, the input terminal of the second latch 231 receives the first intermediate control signal SET from the combinational network 220 and the input terminal of the third latch 232 receives the second intermediate control signal RES from the combinational network 220.

The first latch 230, the second latch 231 and the third latch 232 each further comprise a first NMOS transistor N31, a second NMOS transistor N32 and a third NMOS transistor N33 inserted, in series to one another, between the first internal circuit node X31 and ground GND. The first NMOS transistor N31 has a control or gate terminal receiving an inverted clock signal CKN, the second NMOS transistor N32 has a control or gate terminal receiving the asynchronous active-low reset signal ARN and the third NMOS transistor N33 has a control or gate terminal connected to the input terminal IN3.

Furthermore, the first latch 230, the second latch 231 and the third latch 232 each comprise a third PMOS transistor P33 being inserted between the voltage reference VDD and the first internal circuit node X31, and having a control or gate terminal receiving the asynchronous active-low reset signal ARN.

The first latch 230, the second latch 231 and the third latch 232 each also comprise: a fourth PMOS transistor P34 and a fourth NMOS transistor N34, inserted, in series to each other, between the voltage reference VDD and ground GND, having respective control or gate terminals connected to the first internal circuit node X31 and being interconnected to one another at a second internal circuit node X32; a fifth PMOS transistor P35 and a fifth NMOS transistor N35, inserted, in series to each other, between the voltage reference VDD and ground GND, having respective control or gate terminals connected to the second internal circuit node X32 and being interconnected to one another at a third internal circuit node X33; and a sixth PMOS transistor P36 and a sixth NMOS transistor N36, inserted, in series to each other, between the voltage reference VDD and ground GND, having respective control or gate terminals connected to the third internal circuit node X33 and being interconnected to one another at an output terminal OUT3 providing the output data Q.

Within the latch architecture 200, the output terminal of the first latch 230 provides the latched first intermediate data NDATA_L to the decoder 240; the output terminal of the second latch 231 provides the latched first intermediate control signal SET_L to the first AND gate 250; and the output terminal of the third latch 232 provides the latched second intermediate control signal RES_L to the second AND gate 251.

Moreover, the first latch 230, the second latch 231 and the third latch 232 each comprise a seventh PMOS transistor P37 and an eighth PMOS transistor P38 inserted, in series to each other, between a voltage reference VDD and the first internal circuit node X31. The seventh PMOS transistor P37 has a control or gate terminal connected to the second internal circuit node X32 and the eighth PMOS transistor P38 has a control or gate terminal receiving the inverted clock signal CKN.

Finally, the first latch 230, the second latch 231 and the third latch 232 each comprise a seventh NMOS transistor N37, an eighth NMOS transistor N38 and a ninth NMOS transistor N39 inserted, in series to one another, between the first internal circuit node X31 and ground GND. The seventh NMOS transistor N37 has a control or gate terminal receiving the clock signal CK, the eighth NMOS transistor N38 has a control or gate terminal receiving the asynchronous active-low reset signal ARN and the ninth NMOS transistor N39 has a control or gate terminal connected to the second internal circuit node X32.

Figure 4A:
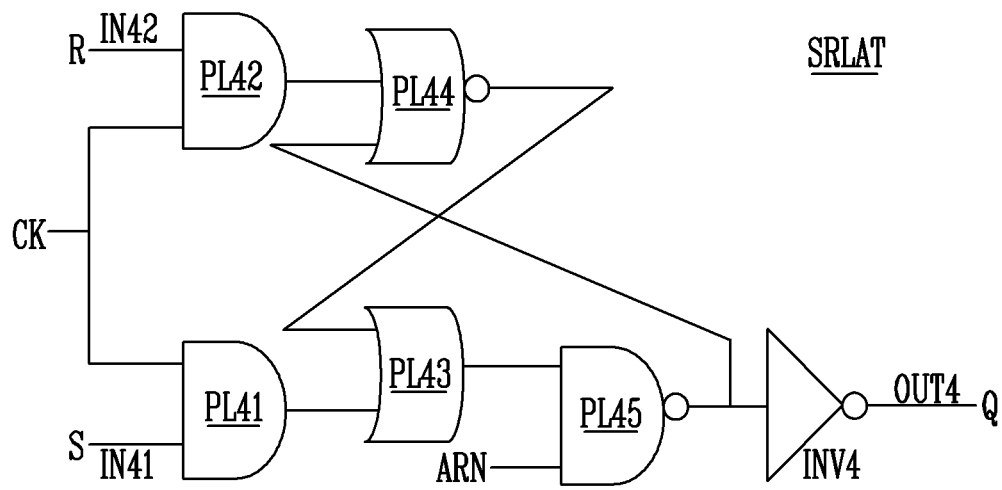

According to an embodiment of the present disclosure, as shown in FIG. 4A, the fourth latch 260 comprises a first logic gate PL41 having a first input terminal connected to a first input terminal IN41 of the fourth latch 260 and a second input terminal receiving a clock signal CK, as well as a second logic gate PL42 having a first input terminal receiving the clock signal CK and a second input terminal connected to a second input terminal IN42 of the fourth latch 260. The first logic gate PL41 and the second logic gate PL42 have corresponding output terminals connected to first input terminals of a third logic gate PL43 and of a fourth logic gate PL44, respectively.

The third logic gate PL43 has an output terminal connected to a first input terminal of a fifth logic gate PL45, which has a second input terminal receiving an asynchronous active-low reset signal ARN and an output terminal connected, through an inverter INV4 to an output terminal OUT4 of the fourth latch 260.

The fourth logic gate PL44 has a second input terminal connected to the output terminal of the fifth logic gate PL45 and its output terminal is connected to a second input terminal of the third logic gate PL43.

The first logic gate PL41 and the second logic gate PL42 are AND gates, the third logic gate PL43 is an OR gate, the fourth logic gate PL44 is a NOR gate and the fifth logic gate PL45 is a NAND gate.

Within the latch architecture 200, the first input terminal IN41 of the fourth latch 260 receives the set-enabled second intermediate data $2^N$ DATA_S from the first logic gate 250, the second input terminal IN42 of the fourth latch 260 receives the reset-enabled second intermediate data $2^N$ DATA_R from the second logic gate 251 and the output terminal OUT4 provides the output data MC_OUT.

Figure 4B:
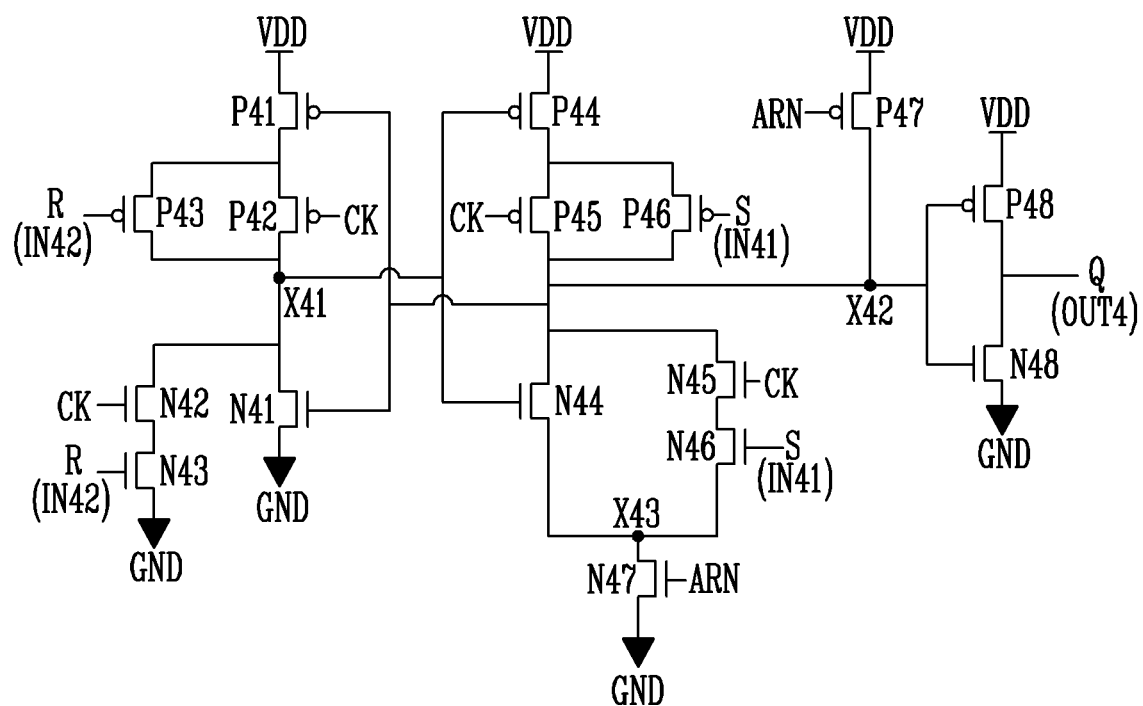

The fourth latch 260 is realized by means of MOS transistors of the N-type and of the P-type according to the embodiment of the present disclosure shown in FIG. 4B.

According to this embodiment, the fourth latch 260 comprises a first PMOS transistor P41 and a second PMOS transistor P42 inserted, in series to each other, between a voltage reference VDD and a first internal circuit node X41, as well as a third PMOS transistor P43 inserted in parallel with the second PMOS transistor P42. The fourth latch 260 further comprises a first NMOS transistor N41 inserted between the first internal circuit node X41 and ground GND, as well as a second NMOS transistor N42 and a third NMOS transistor N43 inserted, in series to each other, between the first internal circuit node X41 and ground GND.

The first PMOS transistor P41 and the first NMOS transistor N41 have respective control or gate terminals connected to a second internal node X42, the second PMOS transistor P42 and second NMOS transistor N42 have respective control or gate terminals receiving the clock signal CK and the third PMOS transistor P43 and third NMOS transistor N43 have respective control or gate terminals receiving an input signal R at the second input terminal IN42.

The fourth latch 260 further comprises a fourth PMOS transistor P44 and a fifth PMOS transistor P45 inserted, in series to each other, between a voltage reference VDD and the second internal circuit node X42, as well as a sixth PMOS transistor P46 inserted in parallel with the fifth PMOS transistor P45. The fourth latch 260 further comprises a fourth NMOS transistor N44 inserted between the second internal circuit node X42 and a third internal circuit node X43, as well as a fifth NMOS transistor N45 and a sixth NMOS transistor N46 inserted, in series to each other, between the second internal circuit node X42 and the third internal circuit node X43.

The fourth PMOS transistor P44 and the fourth NMOS transistor N44 have respective control or gate terminals connected to the first internal node X41, the fifth PMOS transistor P45 and fifth NMOS transistor N45 have respective control or gate terminals receiving the clock signal CK and the sixth PMOS transistor P46 and sixth NMOS transistor N46 have respective control or gate terminals connected to the first input terminal IN41 of the fourth latch 260.

Within the latch architecture 200, the first input terminal IN41 of the fourth latch 260 receives the set-enabled second intermediate data $2^N$ DATA_S and the second input terminal IN42 of the fourth latch 260 receives the reset-enabled second intermediate data $2^N$ DATA_R.

Furthermore, the fourth latch 260 comprises a seventh PMOS transistor P47 inserted between the voltage reference VDD and the second internal circuit node X42 and having a control or gate terminal receiving an asynchronous active-low reset signal ARN, as well as a seventh NMOS transistor N47 inserted between the third internal circuit node X43 and ground GND, and having a control or gate terminal receiving the asynchronous active-low reset signal ARN.

Finally, the fourth latch 260 comprises an eighth PMOS transistor P48 and an eighth NMOS transistor N48 inserted, in series to each other, between the voltage reference VDD and ground GND, having respective control or gate terminals connected to the second internal circuit node X42 and being interconnected at the output terminal OUT4 of the fourth latch 260.

Within the latch architecture 200, the output terminal OUT4 of the fourth latch 260 provides the output data MC_OUT.

Figure 5:
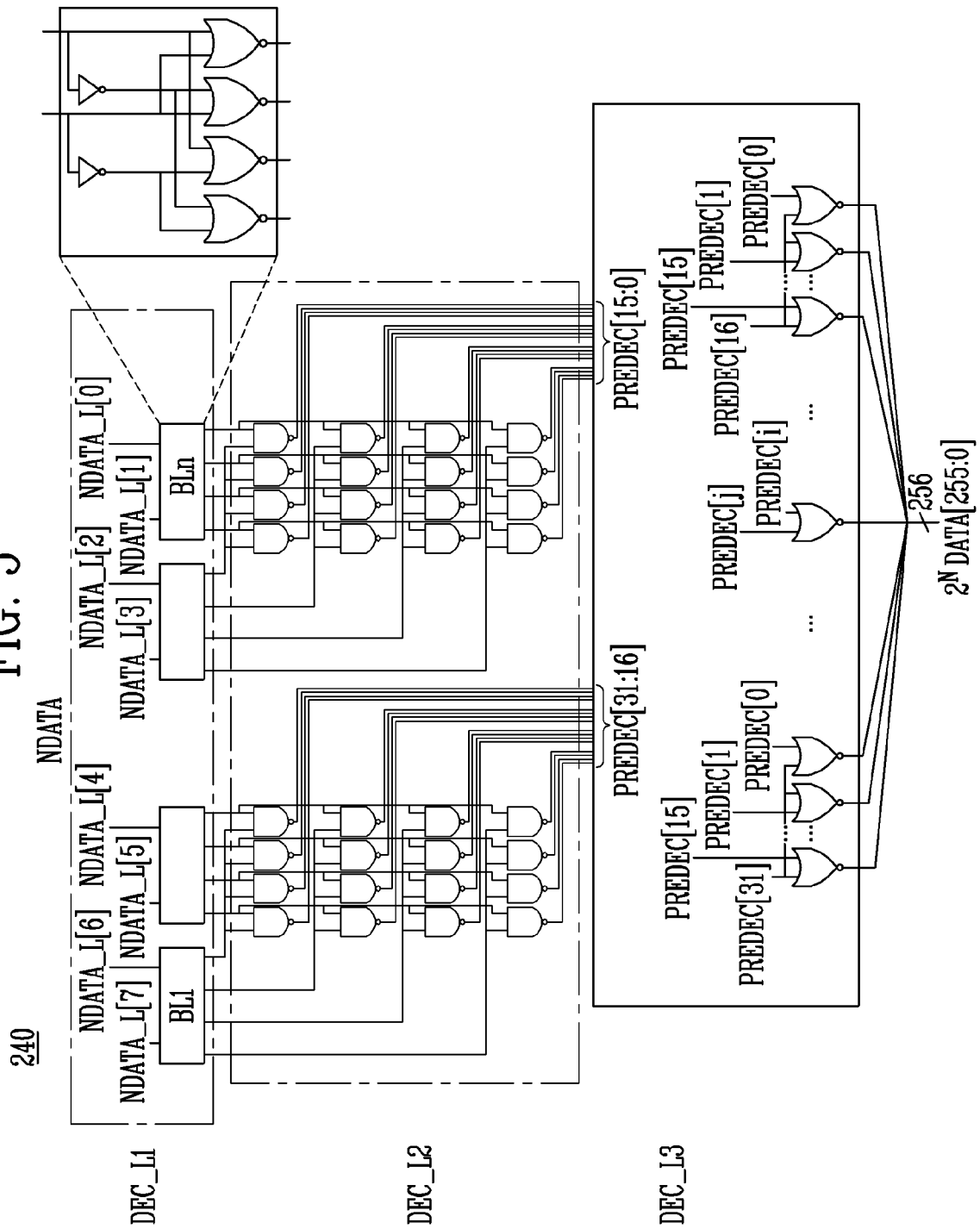
FIG. 5 shows internal structures of a decoder of the latch architecture of FIG. 2.

According to an embodiment of the present disclosure, the decoder 240 of the latch architecture 200 comprises different levels of logic gates, as shown in FIG. 5.

More specifically, the first intermediate data NDATA is received by a first decoding level DEC_L1, which comprises a plurality of logic blocks BL1-BLn, each including a row of NOR logic gates, as shown in the logic block BLn of the first decoding level DEC_L1.

The first decoding level DEC_L1 is connected to a second decoding level DEC_L2, in turn including a plurality of NAND gates able to provide pre-decoded values to a third decoding level DEC_L3, which in turn comprises a plurality of NOR gates, namely 256 NOR gates and provides the second intermediate data $2^N$ DATA.

Figure 6:
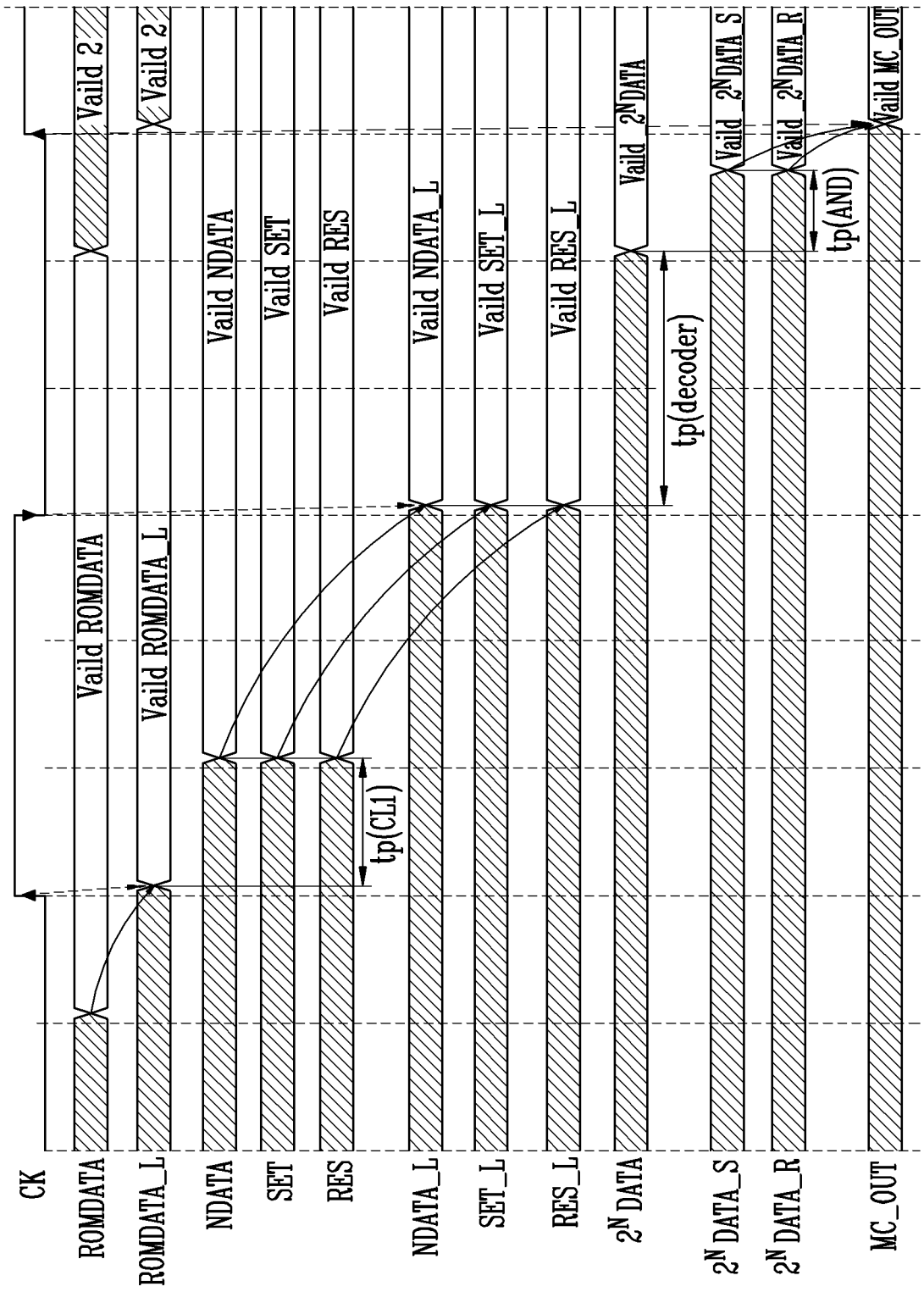
FIG. 6 shows the timing of internal signals of the latch architecture of FIG. 2.

FIG. 6 shows the timing of the different data signal propagating within the latch architecture 200 of FIG. 2 with respect to the pulses of the clock signal CK.

In particular, FIG. 6 shows how the input data ROMDATA are transferred by the input circuit 210 as latched input data ROMDATA_L to the combinational network 220 at a first rising edge of the clock signal CK and, after a first delay time tp(CL1) due to the working of the combinational network 220, output as first intermediate data NDATA for the first latch 230, as a first intermediate control signal SET for the second latch 231 and as a second intermediate control signal RES for the third latch 232.

The first latch 230 in turn provides the latched first intermediate data NDATA_L to the decoder 240 at a first falling edge of the clock signal CK. Likewise, at the first falling edge of the clock signal CK, the second latch 231 provides the latched first intermediate control signal SET_L to the first AND gate 250. Similarly, at the first falling edge of the clock signal CK, the third latch 232 provides the latched second intermediate control signal RES_L to the second AND gate 251.

After a second delay time tp(decoder), the decoder 240 provides the second intermediate data $2^N$ DATA to the first AND gate 250 and to the second AND gate 251.

After a third delay time tp(AND), the first AND gate 250 provides set-enabled second intermediate data $2^N$ DATA_S to the first input IN41 of the fourth latch 260, as well as the second AND gate 251 provides reset-enabled second intermediate data $2^N$ DATA_R to the second input IN42 of the fourth latch 260. The fourth latch 260, in turn, outputs the output data MC_OUT at a second rising edge of the clock signal CK.

Suitably, the first latch 230, the second latch 231 and the third latch 232 are transparent when the clock signal CK is at a low level following the first falling edge. On the other hand, the fourth latch 260 is transparent when the clock signal CK is at a high level following the second rising edge.

Figure 7A:
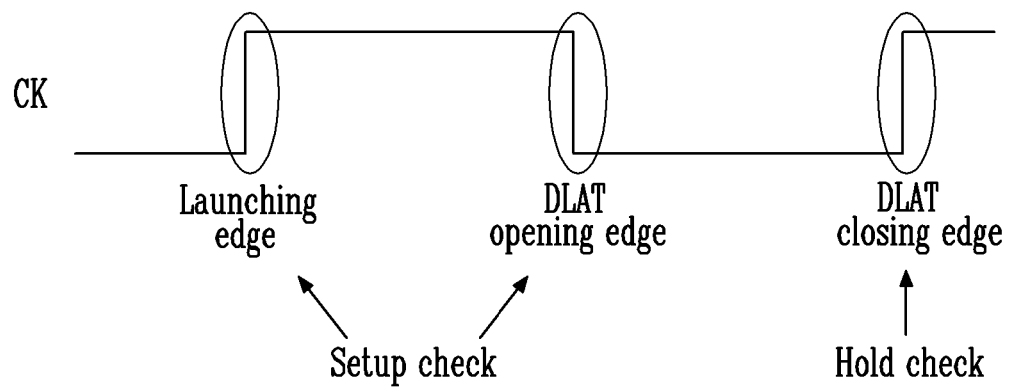
FIGS. 7A-7B show how the latch architecture of FIG. 2 operates in different phases according to clock signal edges.
Figure 7B:
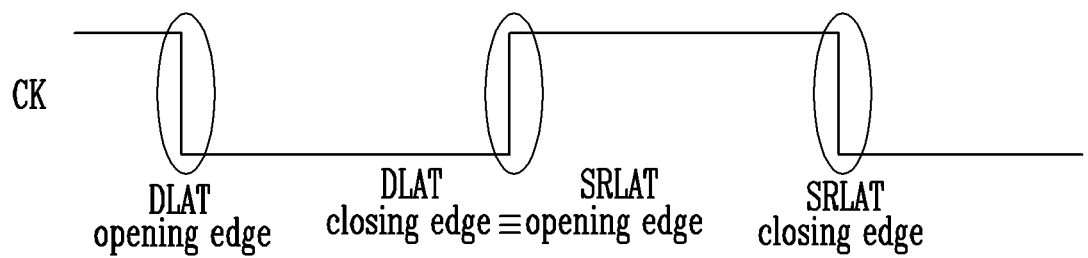

The working of the latch architecture 200 according to the pulses of the clock signal CK is shown in FIGS. 7A-7B.

In particular, with reference to FIG. 2, FIG. 7A shows that the data are transferred from the input circuit 210 to the combinational network 220 at a first rising edge of the clock signal CK, indicated as launching edge, the input circuit 210 being an edge-triggered object. In principle, the combinational network 220 shall produce a valid output on each of its outputted NDATA, SET and RES within the first falling edge of the clock signal CK, indicated as DLAT opening edge. The time period between the launching edge and the DLAT opening edge of the clock signal CK is a setup check period for the first latch 230, the second latch 231 and the third latch 232.

The following rising edge of the clock signal CK is indicated as DLAT closing edge, and holding is evaluated with respect to a closing edge being the endpoint of the latching.

Moreover, as shown in FIG. 7B, from the DLAT opening edge till to the following rising edge, indicated as DLAT closing edge, the latched first intermediate data NDATA_L are transferred to the decoder 240, the latched first intermediate control signal SET_L is transferred to the first AND gate 250 and the latched second intermediate control signal RES_L is transferred to the second AND gate 251.

The decoder 240, during a period between the DLAT opening edge and the DLAT closing edge, provides the second intermediate data $2^N$ DATA to the first AND gate 250 and to the second AND gate 251.

Subsequently, at a following rising edge of CK, indicated as SRLAT opening edge, which coincides with DLAT closing edge, the first AND gate 250 provides set-enabled second intermediate data $2^N$ DATA_S to the first input IN41 of the fourth latch 260 and the second AND gate 251 provides reset-enabled second intermediate data $2^N$ DATA_R to the second input IN42 of the fourth latch 260.

Finally, at a further falling edge of the clock signal CK, indicated as SRLAT closing edge, the fourth latch 260, being a gated SR latch, provides the output data MC_OUT to the output terminal OUT of the latch architecture 200.

It can be verified that, using the latch architecture 200 according to the embodiments of the present disclosure, the second register MC_OUTREGS shows an area saving between 15.9% and 17.9%. Likewise, the registers comprising the output data MC_OUT show an area saving between 10.0% and 13.3%. On the contrary, the first register MC_OUTREGDRVR shows an increase of the area occupation between 15.1% and 16.5%. In any case, the total area saving for the microcontroller is equal to 4.3% on average.

In essence, the latch architecture according to the embodiments of the present disclosure, using a D-latch (DLAT) and a gated SR-latch (SRLAT) in the circuit outputting data shows a reduction in the area occupation. The use of a SRLAT, allowing to keep memory of the previously received data even when the clock signal CK is high and both the first and the second input are low, also contributes to reduce area occupation with respect to a DLAT-only architecture, where a multiplexing logic with output fed back to the input of the same latch would be required.

Moreover, the latch architecture has a synchronous behaviour, thanks to the fact that the latches included therein are respectively synchronized with the falls and rises of the same clock signal.

From the foregoing it will be appreciated that, although specific embodiments of the present invention have been described herein for purposes of illustration, various modifications may be made without deviating from the spirit and scope of the invention. Accordingly, the invention is not limited except by the appended claims.

What is claimed:

1. A latch architecture having an input terminal receiving input data and an output terminal providing output data, the latch architecture comprising:

an input circuit connected to the input terminal of the latch architecture, receiving the input data from the input terminal and providing latched input data;

a combinational network connected to the input circuit, receiving the latched input data from the input circuit and providing first intermediate data, a first intermediate control signal and a second intermediate control signal;

wherein the latch architecture further comprises:

one or more first latches connected to the combinational network, receiving the first intermediate data and providing latched first intermediate data;

a second latch connected to the combinational network, receiving the first intermediate control signal and providing a latched first intermediate control signal;

a third latch connected to the combinational network, receiving the second intermediate control signal and providing a latched second intermediate control signal;

at least one fourth latch connected to the output terminal of the latch architecture and providing the output data;

a decoder connected to the first latch and receiving the latched first intermediate data;

at least one first AND gate connected to the decoder, receiving second intermediate data from the decoder, and the latched first intermediate control signal from the second latch, and providing set-enabled second intermediate data to a first input terminal of the fourth latch; and at least one second AND gate connected to the decoder, receiving second intermediate data from the decoder and the latched second intermediate control signal from the third latch, and providing reset-enabled second intermediate data to a second input terminal of the fourth latch, wherein the first AND gate and the second AND gate provide the fourth latch with respective input signals;

wherein the one or more first latches, the second latch and the third latch receive a clock signal at an inverted clock terminal and the fourth latch receives the clock signal at a clock terminal.

2. The latch architecture of claim 1, wherein the decoder is an n-to-$2^n$ decoder, and the latched first intermediate data being an n-bit signal is transferred to the second intermediate data being a $2^n$-bit signal, where n is greater than or equal to 1.

3. The latch architecture of claim 1, wherein the one or more first latches, the second latch and the third latch are level-sensitive latches, further receiving an asynchronous active-low reset signal.

4. The latch architecture of claim 3, wherein the at least one fourth latch is a gated SR latch, further receiving the asynchronous active-low reset signal.

5. The latch architecture of claim 1, wherein the input circuit is a delay flip-flop, further receiving an asynchronous active-low reset signal.

6. The latch architecture of claim 1, wherein the first latches, the second latch and the third latch are included into a first register of a microcontroller and are connected to the at least one fourth latches included in a second register of the microcontroller by means of a plurality of combinational blocks of the decoder and two logic AND gates.

7. The latch architecture of claim 3, wherein each of the one or more first latches has an input terminal receiving the first intermediate data from the combinational network and an output terminal providing the latched first intermediate data to the decoder, wherein the second latch has an input terminal receiving the first intermediate control signal from the combinational network and an output terminal providing the latched first intermediate control signal to the first AND gate, wherein the third latch has an input terminal receiving the second intermediate control signal from the combinational network and an output terminal providing the latched second intermediate control signal to the second AND gate, wherein each of the one or more first latches, the second latch and the third latch comprises:

a first logic gate having a first input terminal connected to an input terminal of the respective latch and a second input terminal receiving a clock signal through a first inverter;

a second logic gate having a first input terminal receiving the clock signal through the first inverter and a second input terminal connected to the input terminal of the respective latch through a second inverter;

a third logic gate having a first input terminal connected to an output terminal of the first logic gate; and a fourth logic gate having a first input terminal connected to an output terminal of the second logic gate, wherein the third logic gate and the fourth logic gate are cross connected, the third logic gate having an output terminal connected to a second input terminal of the fourth logic gate, and the fourth logic gate having an output terminal connected to a second input terminal of the third logic gate, and wherein the fourth logic gate further includes a third input terminal receiving the asynchronous active-low reset signal and the output terminal connected through a third inverter to the output terminal of the first latch.

8. The latch architecture of claim 7, wherein the first logic gate, the second logic gate, the third logic gate and the fourth logic gate of each latch are NAND gates.

9. The latch architecture of claim 3, wherein each of the one or more first latches has an input terminal receiving the first intermediate data from the combinational network and an output terminal providing the latched first intermediate data to the decoder, wherein the second latch has an input terminal receiving the first intermediate control signal from the combinational network and an output terminal providing the latched first intermediate control signal to the first AND gate, wherein the third latch has an input terminal receiving the second intermediate control signal from the combinational network and an output terminal providing the latched second intermediate control signal to the second AND gate, and wherein each of the one or more first latches, the second latch and the third latch comprises:

a first PMOS transistor and a second PMOS transistor being inserted, in series to each other, between a voltage reference and a first internal circuit node, the first PMOS transistor having a control terminal connected to an input terminal of the respective latch, and the second PMOS transistor having a control terminal receiving the clock signal;

a first NMOS transistor, a second NMOS transistor and a third NMOS transistor being inserted, in series to one another, between the first internal circuit node and ground, the first NMOS transistor having a control terminal receiving an inverted clock signal, the second NMOS transistor having a control terminal receiving the asynchronous active-low reset signal and the third NMOS transistor having a control terminal connected to the input terminal of the respective latch; and a third PMOS transistor being inserted between the voltage reference and the first internal circuit node and having a control terminal receiving the asynchronous active-low reset signal.

10. The latch architecture of claim 9, wherein each of the one or more first latches, the second latch and the third latch further comprises:

a fourth PMOS transistor and a fourth NMOS transistor being inserted, in series to each other, between the voltage reference and ground, and having respective control terminals connected to the first internal circuit node and being interconnected to one another at a second internal circuit node;

a fifth PMOS transistor and a fifth NMOS transistor being inserted, in series to each other, between the voltage reference and ground, and having respective control terminals connected to the second internal circuit node and being interconnected to one another at a third internal circuit node; and a sixth PMOS transistor and a sixth NMOS transistor being inserted, in series to each other, between the voltage reference and ground, and having respective control terminals connected to the third internal circuit node and being interconnected to one another at an output terminal of the respective latch.

11. The latch architecture of claim 10, wherein each of the one or more first latches, the second latch and the third latch further comprises:

a seventh PMOS transistor and an eighth PMOS transistor being inserted, in series to each other, between a voltage reference and the first internal circuit node, the seventh PMOS transistor having a control terminal connected to the second internal circuit node and the eighth PMOS transistor having a control terminal receiving the inverted clock signal: and a seventh NMOS transistor, an eighth NMOS transistor and a ninth NMOS transistor being inserted, in series to one another, between the first internal circuit node and ground, the seventh NMOS transistor having a control terminal receiving the clock signal, the eighth NMOS transistor having a control terminal receiving the asynchronous active-low reset signal and the ninth NMOS transistor having a control terminal connected to the second internal circuit node.

12. The latch architecture of claim 4, wherein the fourth latch has a first input terminal receiving the set-enabled second intermediate data from the first AND gate, a second input terminal receiving the reset-enabled second intermediate data from the second AND gate and an output terminal providing the output data, wherein the fourth latch further comprises:

a first logic gate having a first input terminal connected to the first input terminal of the fourth latch and a second input terminal receiving a clock signal;

a second logic gate having a first input terminal receiving the clock signal and a second input terminal connected to the second input terminal of the fourth latch;

a third logic gate having a first input terminal connected to an output terminal of the first logic gate;

a fourth logic gate having a first input terminal connected to an output terminal of the second logic gate; and a fifth logic gate having a first input terminal connected to an output terminal of the third logic gate, a second input terminal receiving the asynchronous active-low reset signal and an output terminal connected, through an inverter, to the output terminal of the fourth latch, wherein the fourth logic gate includes a second input terminal connected to the output terminal of the fifth logic gate and an output terminal connected to a second input terminal of the third logic gate.

13. The latch architecture of claim 12, wherein the first logic gate and the second logic gate of the fourth latch are AND gates, the third logic gate of the fourth latch is an OR gate, the fourth logic gate of the fourth latch is a NOR gate and the fifth logic gate of the fourth latch is a NAND gate.

14. The latch architecture of claim 4, wherein the fourth latch has a first input terminal receiving the set-enabled second intermediate data from the first AND gate, a second input terminal receiving the reset-enabled second intermediate data from the second AND gate and an output terminal providing the output data, wherein the fourth latch further comprises:

a first PMOS transistor and a second PMOS transistor being inserted, in series to each other, between a voltage reference and a first internal circuit node;

a third PMOS transistor being inserted in parallel with the second PMOS transistor;

a first NMOS transistor being inserted between the first internal circuit node and ground; and a second NMOS transistor and a third NMOS transistor being inserted, in series to each other, between the first internal circuit node and a ground, wherein the first PMOS transistor and the first NMOS transistor include respective control terminals connected to a second internal circuit node, the second PMOS transistor and second NMOS transistor having respective control terminals receiving the clock signal, and the third PMOS transistor and third NMOS transistor having respective control terminals connected to the second input terminal of the fourth latch.

15. The latch architecture of claim 14, wherein the fourth latch further comprises:

a fourth PMOS transistor and a fifth PMOS transistor inserted, in series to each other, between a voltage reference and the second internal circuit node;

a sixth PMOS transistor being inserted in parallel with the fifth PMOS transistor;

a fourth NMOS transistor being inserted between the second internal circuit node and a third internal circuit node; and a fifth NMOS transistor and a sixth NMOS transistor being inserted, in series to each other, between the second internal circuit node and the third internal circuit node, wherein the fourth PMOS transistor and the fourth NMOS transistor include respective control terminals connected to the first internal circuit node, the fifth PMOS transistor and fifth NMOS transistor having respective control terminals receiving the clock signal and the sixth PMOS transistor and sixth NMOS transistor having respective control terminals connected to the first input terminal of the fourth latch.

16. The latch architecture of claim 15, wherein the fourth latch further comprises:

a seventh PMOS transistor being inserted between the voltage reference and the second internal circuit node and having a control terminal receiving the asynchronous active-low reset signal; and a seventh NMOS transistor being inserted between the third internal circuit node and the ground and having a control terminal receiving the asynchronous active-low reset signal.

17. The latch architecture of claim 16, wherein the fourth latch further comprises:
an eighth PMOS transistor and an eighth NMOS transistor being inserted, in series to each other, between the voltage reference and the ground, and having respective control terminals connected to the second internal circuit node and being interconnected at the output terminal of the fourth latch.

18. The latch architecture of claim 2, wherein the decoder receives the latched first intermediate data from the first latch and provides second intermediate data to the first AND gate and to the second AND gate by means of different levels of logic gates.

19. The latch architecture of claim 18, wherein the decoder comprises:
a first decoding level, which comprises a plurality of logic blocks receiving the latched first intermediate data, each logic block including a row of NOR logic gates;
a second decoding level connected to the first decoding level and including a plurality of NAND gates able to provide pre-decoded values; and
a third decoding level connected to the second decoding level, and comprising a plurality of NOR gates receiving the pre-decoded values and providing the second intermediate data.

20. A latch circuit comprising:
input and output terminals;
an input circuit coupled to the input terminal, and configured to receive input data from the input terminal and generate latched input data;
a combinational network coupled to the input circuit, and configured to receive the latched input data from the input circuit and generate first intermediate data, a first intermediate control signal and a second intermediate control signal using the latched input data;
a first register coupled to the combinational network, and configured to receive the first intermediate data, the first intermediate control signal and the second intermediate control signal, and generate latched first intermediate data, a latched first intermediate control signal and a latched second intermediate control signal using a clock signal and an asynchronous active-low reset signal;
a decoder coupled to the first register, and configured to receive the latched first intermediate data and generate second intermediate data;
one or more logic gates coupled to the decoder and the first register, and configured to receive the second intermediate data, the latched first intermediate control signal and the latched second intermediate control signal, and generate set-enabled second intermediate data and reset-enabled second intermediate data using a combination of the second intermediate data, the latched first intermediate control signal and the latched second intermediate control signal; and
a second register coupled to the logic gates, and configured to receive the set-enabled second intermediate data and the reset-enabled second intermediate data, generate output data using a combination of the set-enabled second intermediate data, the reset-enabled second intermediate data, the clock signal and the asynchronous active-low reset signal, and output the output data to the output terminal,
wherein the first register includes a D-latch and the second register includes an SR-latch.

\* \* \* \* \*